United States Patent
Marion

(10) Patent No.: US 9,368,473 B2
(45) Date of Patent: Jun. 14, 2016

(54) ASSEMBLY METHOD, OF THE FLIP-CHIP TYPE, FOR CONNECTING TWO ELECTRONIC COMPONENTS, ASSEMBLY OBTAINED BY THE METHOD

(71) Applicant: COMMISSARIAT A L'ENERGIE ATOMIQUE ET AUX ENERGIES ALTERNATIVES, Paris (FR)

(72) Inventor: Francois Marion, Saint-martin le Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/429,595

(22) PCT Filed: Sep. 26, 2013

(86) PCT No.: PCT/IB2013/058896

§ 371 (c)(1),
(2) Date: Mar. 19, 2015

(87) PCT Pub. No.: WO2014/049551

PCT Pub. Date: Apr. 3, 2014

(65) Prior Publication Data

US 2015/0235985 A1 Aug. 20, 2015

(30) Foreign Application Priority Data

Sep. 27, 2012 (FR) .................... 12 59082

(51) Int. Cl.
*H01L 23/48* (2006.01)
*H01L 21/60* (2006.01)
*H01L 23/00* (2006.01)

(52) U.S. Cl.
CPC ............... *H01L 24/81* (2013.01); *H01L 24/11* (2013.01); *H01L 24/13* (2013.01);
(Continued)

(58) Field of Classification Search
CPC ......... H01L 24/11; H01L 24/12; H01L 24/13; H01L 24/81; H01L 2924/014; H01L 2224/81203

See application file for complete search history.

(56) References Cited

U.S. PATENT DOCUMENTS

2002/0011677 A1   1/2002   Yokoi et al.
2002/0016022 A1   2/2002   Shintani
(Continued)

FOREIGN PATENT DOCUMENTS

EP   2287904   2/2011
FR   2928033   8/2009
(Continued)

OTHER PUBLICATIONS

B. Goubault De Brugière et al: "Micro tube insertion into indium, copper and other materials for 3D applications", 2010 Electronic Components And Technology Conference (ECTC)., Jun. 1, 2010, pp. 1757-1762.

(Continued)

*Primary Examiner* — Marvin Payen
*Assistant Examiner* — Jeremy Joy
(74) *Attorney, Agent, or Firm* — Norton Rose Fulbright US LLP

(57) ABSTRACT

The invention relates to an assembly method for connecting two electronic components together, said components each having an assembly face, wherein the two assembly faces are moved together in what is known as an assembly direction X, and a given force F is applied to one and/or the other of the components, one and/or the other assembly face(s) having: —connection inserts made of rigid material having an elongate longitudinal shape in the assembly direction X; —connection tracks made of material having a hardness less than that of the inserts and having an elongate longitudinal shape transversely to the assembly direction X, wherein, in said method: —the inserts are aligned opposite corresponding tracks such that the inserts and the tracks form in pairs, after assembly, at least one approximately transverse intersection, —the force F is applied so as make the inserts penetrate into the tracks until the assembly is produced.

24 Claims, 2 Drawing Sheets

(52) U.S. Cl.
CPC ............... *H01L 2224/16227* (2013.01); *H01L 2224/81203* (2013.01); *H01L 2224/81801* (2013.01); *H01L 2924/014* (2013.01); *H01L 2924/0105* (2013.01); *H01L 2924/01013* (2013.01); *H01L 2924/01022* (2013.01); *H01L 2924/01024* (2013.01); *H01L 2924/01029* (2013.01); *H01L 2924/01042* (2013.01); *H01L 2924/01047* (2013.01); *H01L 2924/01049* (2013.01); *H01L 2924/01051* (2013.01); *H01L 2924/01074* (2013.01); *H01L 2924/01078* (2013.01); *H01L 2924/01079* (2013.01); *H01L 2924/01082* (2013.01); *H01L 2924/01083* (2013.01); *H01L 2924/0496* (2013.01); *H01L 2924/04941* (2013.01); *H01L 2924/206* (2013.01); *H01L 2924/2064* (2013.01)

(56) References Cited

U.S. PATENT DOCUMENTS

| | | | |
|---|---|---|---|
| 2002/0104873 A1* | 8/2002 | Lee | H01L 21/563 228/180.22 |
| 2002/0153608 A1* | 10/2002 | Okada | H01L 23/49811 257/737 |
| 2004/0197979 A1* | 10/2004 | Jeong | B23K 3/0607 438/202 |
| 2008/0146071 A1* | 6/2008 | Davoine | H01L 24/11 439/387 |
| 2010/0072631 A1* | 3/2010 | Marion | H01L 24/11 257/779 |
| 2011/0035925 A1* | 2/2011 | Marion | H01L 24/12 29/428 |
| 2011/0041332 A1* | 2/2011 | Saint-Patrice | H01L 24/11 29/837 |
| 2011/0074020 A1* | 3/2011 | Yamakami | H01L 24/11 257/737 |
| 2011/0094789 A1* | 4/2011 | Marion | H01L 24/11 174/266 |
| 2012/0120622 A1* | 5/2012 | Marion | B81C 1/00269 361/758 |
| 2013/0313704 A1* | 11/2013 | Souriau | H01L 24/13 257/737 |

FOREIGN PATENT DOCUMENTS

| | | |
|---|---|---|
| JP | 2002217236 | 8/2002 |
| WO | WO2006/054005 | 5/2006 |
| WO | WO2009/115686 | 9/2009 |

OTHER PUBLICATIONS

B. Goubault De Brugière et al "A 10μm pitch interconnection technology using micro tube insertion into Al—Cu for 3D applications.", 2011 Electronic Components and Technology Conference, 2011, pp. 1400-1406.

D. Saint-Patrice et al. "New Reflow Soldering and Tip in Buried Box (TB2) Techniques For Ultrafine Pitch Megapixels Imaging Array," 2008 Electronic Components and Technology Conference, 2008, pp. 46-53.

* cited by examiner

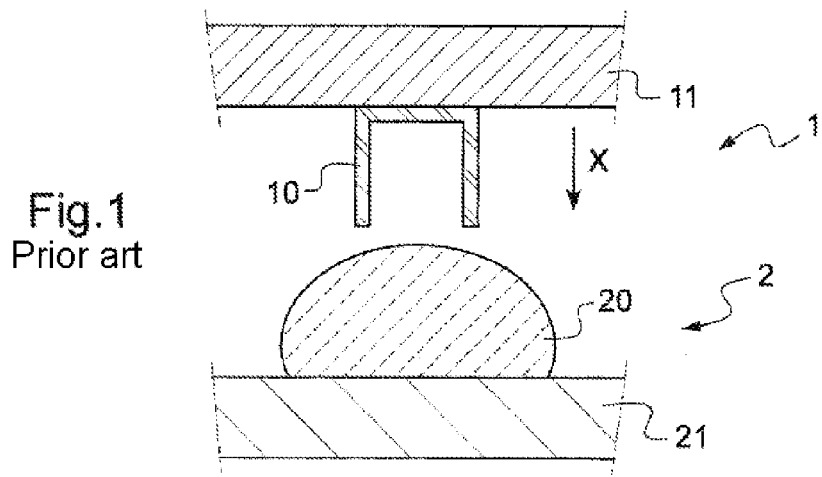
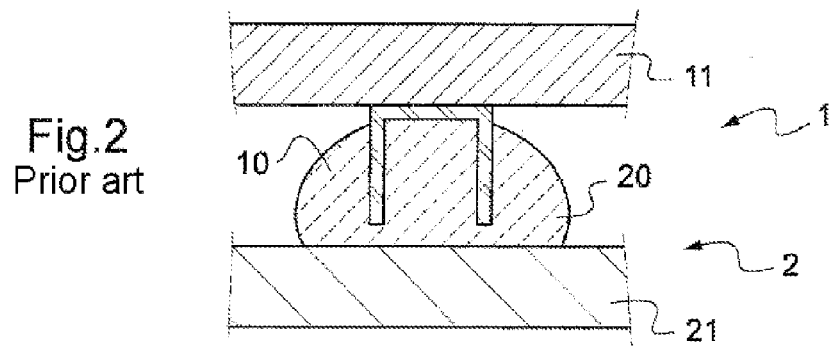
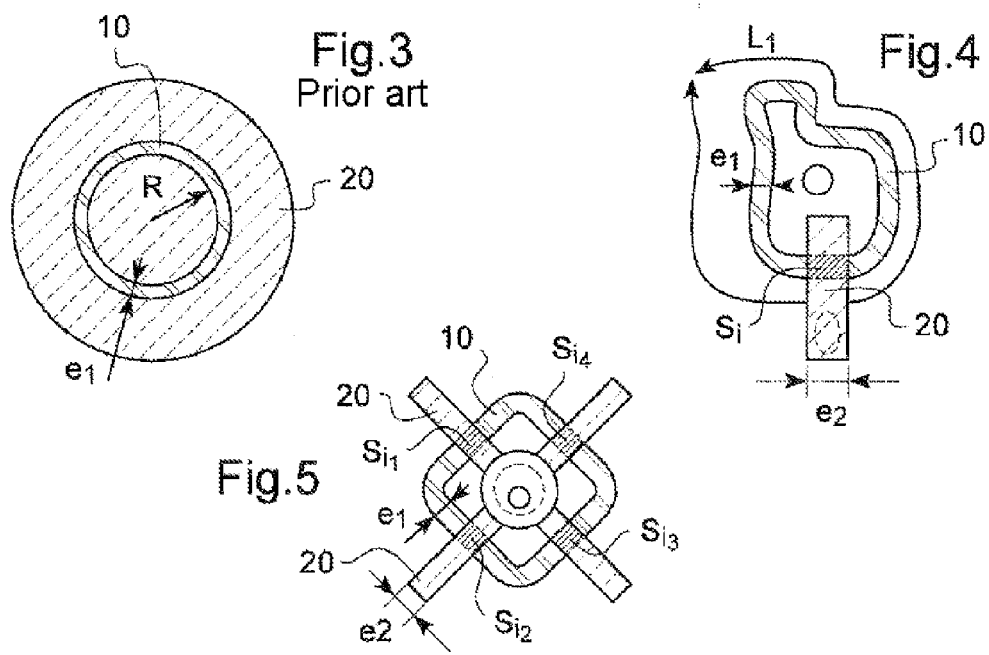

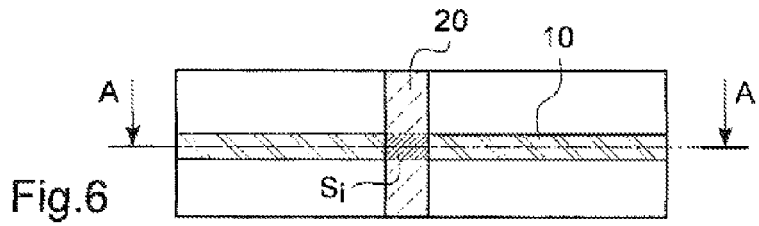
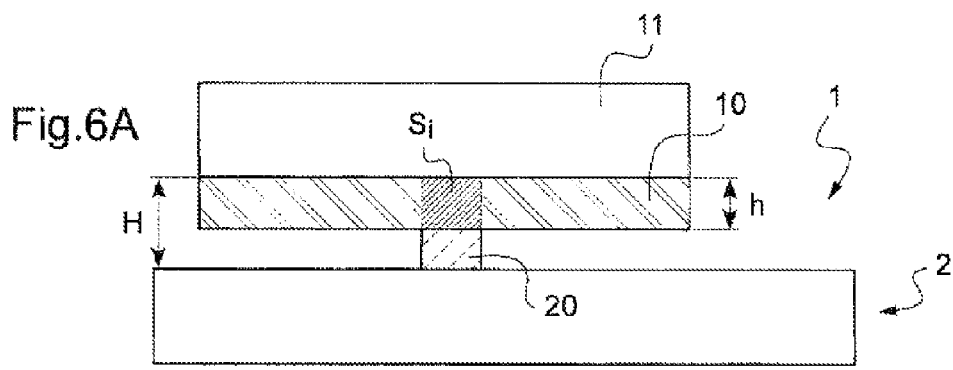
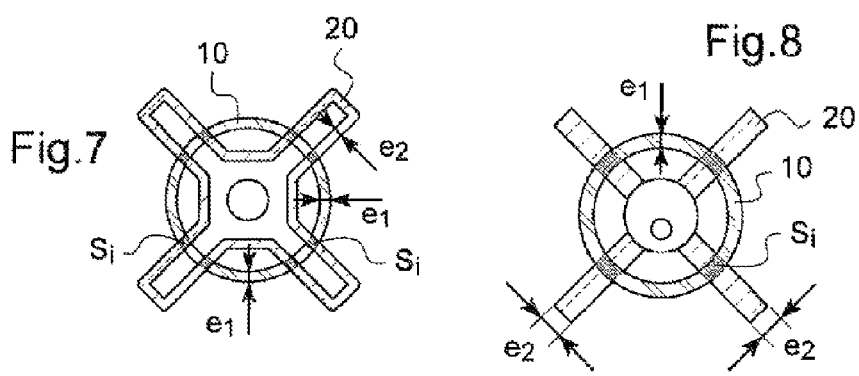
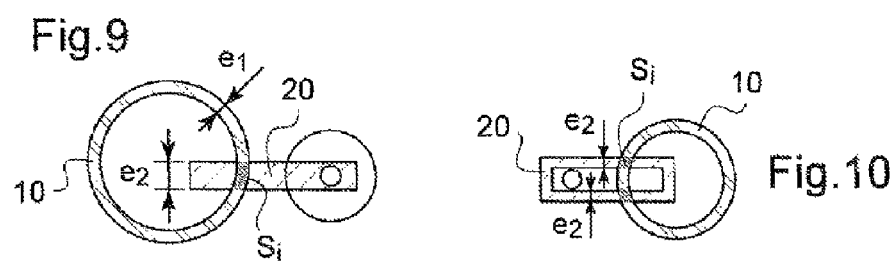

ASSEMBLY METHOD, OF THE FLIP-CHIP TYPE, FOR CONNECTING TWO ELECTRONIC COMPONENTS, ASSEMBLY OBTAINED BY THE METHOD

CROSS-REFERENCE TO RELATED APPLICATIONS

This application is a national phase application under 35 U.S.C. §371 of International Application No. PCT/IB2013/058896 filed 26 Sep. 2013, which claims priority to French Patent Application No. 1259082 filed 27 Sep. 2012. The entire contents of each of the above-referenced disclosures is specifically incorporated herein by reference without disclaimer.

TECHNICAL FIELD

The present invention relates to a flip-chip type process for assembling two electronic components, in which one of the two electronic components is flipped in order to enable front-to-front assembly or electrical connection.

The invention allows electronic components to be assembled whatever their interconnect pitch and the gap between these components.

The invention more particularly relates to assembly of a chip and a substrate, both of which may for example be made of silicon.

The invention aims to decrease the force required to assemble electronic components.

The invention is mainly applicable to any microelectronic devices requiring front-to-front interconnects having a very fine pitch.

One particularly advantageous application of the invention is production of stacked three-dimensional 3D structures or of multispectral heterogeneous imagers.

The expression "assembly of two electronic components" is understood, in the context of the invention, to mean either an assembly of two components made of different materials, or an assembly of two components made of the same material. In particular, an assembly according to the invention may be an assembly of an electronic chip and a substrate, both of which may possibly be made of silicon.

The expression "interconnect pitch" is understood to mean the distance between two connecting tracks on a given electronic component.

The expression "gap between components" is understood to mean the spacing between the two facing components, as defined by the interconnect height.

PRIOR ART

The flip-chip technique is a well-known technique for mechanically and electrically interconnecting or assembling two components, such as a chip and a printed circuit board substrate. This technique is called the flip-chip technique because one of the components, in general the chip, which bears conductors, is flipped in order to bring the two components face to face in order to enable interconnection by bonding of the conductors and metal bumps forming contacts on the other component, in general a printed circuit board substrate.

In this technique it is continuously being sought to decrease the gap between components and increase the number of connections. However, the three main categories of assembly technologies currently used in this technique, namely soldering, thermocompression and the use of adhesives such as ACFs (anisotropic conductive films), are each reaching their limit as regards decreasing gap size.

In particular, low-temperature thermocompression obtained by forcing conductive inserts to penetrate into bumps, such as described in patent application WO 2006/054005, is limited by the very large force required if a very large number of connections are to be formed and by the feasibility of actual production of the inserts.

Thus, to remedy the limits of this method, the Applicant has proposed, in patent application WO 2009/115686, to produce conductive inserts taking the form of blind tubes the bases of which are securely fastened to the surface of a component. Conductive inserts were the subject matter of improvement patent application EP 2 287 904, at least one area of the open end of an insert being left free so as to allow gas contained in the insert to escape during the insertion. Conductive inserts having various novel shapes were provided in this application, examples being an open bar and elements having star-shaped, cross-shaped or lobed cross sections, etc.

FIGS. 1, 2 and 3 show assembly of two electronic components according to the aforementioned application WO 2009/115686. A hollow and open insert 10 taking the form of a blind tube of cylindrical cross section is securely fastened via its base to the surface of a substrate 11 of a first electronic component. A bump 20, typically a solder bump, is securely fastened to the surface of a substrate 21 of a second electronic component 2. The material of the bump 20 is less hard than that of the insert 10. To assemble the two components 1, 2 by thermocompression, the insert 10 is aligned facing the bump 20 and then a substantially constant force F is applied in the assembly direction X shown by the arrow (FIG. 1) until the assembly is obtained, i.e. until the insert 10 has been completely inserted into the bump (FIGS. 2 and 2A).

Although satisfactory on the whole, especially as regards the feasibility of production of the inserts, the method in these patent applications could be improved further.

In particular, there is a need to decrease the magnitude of the force to be applied to assemble two microelectronic components by thermocompression, especially when the interconnects between components require material(s) to be used that must not pass into the liquid state in packaging steps carried out after the actual assembly.

It has been demonstrated in publications [1] and [2] that for a given insert produced in the form of a microtube, the required insertional force depends not only on the mechanical properties of the ductile material itself (hardness, plasticity, etc.) from which the pad is produced but also on the area of insertion, or in other words the area of intersection between the insert 10 and the pad 20 made of ductile material.

Publication[3] moreover explains that the insertional force of a tube is directly proportional to the area of insertion Si of the tube into the pad, and therefore to its wall thickness and to the length L of its perimeter. Thus, in the example shown in FIG. 3, the area of insertion Si of an insert taking the form of a microtube of cylindrical cross section of radius R and of wall thickness e1 is equal to the area of the cross section of the microtube 10 in a horizontal plane, i.e. in the plane orthogonal to the assembly direction X, namely $Si=2*\pi*R*e1$. The insertional force F is therefore equal to $F=k*2*\pi*R*e1$, where k is a constant.

As regards the mechanical properties of the ductile material, when it is desired to carry out an insertion at room temperature, the fact that the insertional force is, to a first order approximation, inversely proportional both to the Young's modulus of the constituent metal of the connecting pad and to its elastic limit at room temperature, must be taken into account. Moreover, among known ductile metals, those having the lowest Young's modulus are those with melting points closest to room temperature. Table 1 below gives the list of ductile metals having both a low Young's modulus and a low melting point.

TABLE 1

| | Metal | | | | |
|---|---|---|---|---|---|
| | Indium (In) | Tin (Sn) | Lead (Pb) | Zinc (Zn) | Aluminum (Al) |
| Young's modulus (GPa) | 11 | 49.9 | 16.1 | 104 | 70 |
| Melting point (° C.) | 156 | 231 | 327 | 419 | 660 |

In addition to the above considerations regarding ductile metals, when an electronic chip and a wafer, or a chip and another chip, are to be assembled by insertional thermocompression, the connections should be formed with materials that will not pass into the liquid state in the packaging steps carried out after the insertion. These packaging steps employ temperatures of up to 230° C. This temperature of 230° C. is that required to solder the electronic components to a printed circuit board using an AgCuSn solder.

Thus, on the basis of table 1, only aluminum is able to respect all of the technical constraints. Specifically, indium has a melting point below 230° C., tin is liable to create whisker-type defects, and lead is prohibited. Zinc (Zn) would be suitable but it remains less advantageous than aluminum (Al), the latter having a high Young's modulus.

Nonetheless, aluminum still has a substantial Young's modulus, which has the following drawbacks:
  it complexifies inserting machine design, all the more so when there are a large number of connections: by way of example, producing 106 connections in accordance with patent application WO 2009/115686 requires an insertional force of 5000 N to be applied;
  it means that substantial lengths of time must be dedicated to the insertion, these lengths of time being proportional to the required insertional force; and
  it leads to a risk that active layers underlying the connecting pads will be destroyed, because of the force exerted on the inserts during the insertion.

The inventor was therefore confronted with the problem of decreasing the forces of insertion into a given ductile material, more particularly into aluminum.

The general aim of the invention is to provide an improvement of the assembly method disclosed in the aforementioned patent applications WO 2009/115686 and EP 2 287 904 and that at least partially mitigates the aforementioned drawbacks of the prior art.

One particular aim of the invention is to provide a solution that decreases the insertional force required to assemble two microelectronic components using a low-temperature thermocompression method, and that prevents any risk of electrical short-circuits between the conductive inserts of a component and the connecting tracks of the other component.

SUMMARY OF THE INVENTION

To do this, the subject of the invention is a flip-chip type process for assembling two electronic components, said components each comprising what is referred to as an assembly side, in which the two assembly sides are brought nearer to each other in what is referred to as an assembly direction X and a given force F is applied to one and/or other of the components, one and/or other of the assembly sides comprising:
  connecting inserts made of a rigid material having an elongate longitudinal shape in the assembly direction X; and
  connecting tracks made of a material of lower hardness than that of the inserts and of elongate longitudinal shape transversely to the assembly direction X, process in which:
  the inserts are aligned facing the corresponding tracks so that the inserts and the tracks form, pairwise, after assembly, at least one substantially transversal intersection; and
  then, the given force F is applied in order to make the inserts penetrate into the tracks until the assembly of the two components is obtained.

According to one preferred embodiment, the connecting inserts of a component have a unitary wall thickness e1 and a unitary wall length L1 whereas the connecting tracks of a component have a unitary thickness e2, the unitary thicknesses e1 and e2 being the smallest dimensions considered transversely to the assembly direction X, and the length L1 being the largest wall dimension considered transversely to the assembly direction X, process in which, before the inserts have been aligned facing the corresponding tracks, the dimensions e1, e2 and L1 are defined so that each area of insertion Si between a given insert and track is substantially equal to a multiple N of the product of the unitary thicknesses N=n*e1*e2 where n is an integer, this multiple N being very much lower than the cross-sectional area S1 of an insert considered transversely to the assembly direction S1=L1*e1.

The expression "very much lower than the cross-sectional area S1 of an insert" is understood to mean only a very small portion of the cross-sectional area of an insert makes contact with the ductile connecting material during the insertion, this very small portion moreover being enough to ensure the mechanical rigidity of each connection produced. Advantageously, the area of insertion Si is smaller by at least 40% than the cross-sectional area S1.

An insert according to the invention may comprise one or more walls. Thus, the expression "unitary wall length L1" is understood to mean the perimeter bounded by these one or more walls. For example, for a star-shaped wall, the unitary length is the sum of all the lengths of the arms of the star, which make up the perimeter.

A connecting track according to the invention consists of a continuous metal deposit having any possible shape. Thus, a single insert may be inserted into a plurality of portions of a given track, and therefore the area of insertion Si to be considered according to the invention comprises all the intersections between a thickness of a track and an insert.

In other words, the invention essentially consists in very substantially decreasing the cross section of the ductile material of a component that each insert of the other component penetrates when they are assembled by connection therebetween. The invention is simple to implement since all that needs to be done is produce very thin tracks of ductile material; there is no need to modify the shape or the dimensions or the hard material that makes up the inserts or the process used to produce them known from the aforementioned patent applications WO 2009/115686 and EP 2 287 904.

By virtue of the invention, it is possible to decrease considerably the forces of insertion to be applied to form the connections. As a corollary, the need for insertion machines of complex design is thus avoided and the lengths of time required to implement the actual insertion steps is considerably decreased.

The unitary wall thickness e1 of the inserts may be comprised between 0.1 and 1 µm and preferably between 0.1 and 0.5 µm.

The unitary track thickness e2 may be comprised between 0.05 and 2 µm and preferably between 0.1 and 1 µm.

According to one variant embodiment, the constituent material of the tracks is preferably a ductile metallic material chosen from aluminum Al, indium In, gold Au, tin Sn, lead Pb, bismuth, antimony Sb, zinc Zn, an aluminum-copper alloy AlCu and the alloys SnAgCu, SnAg, AgCu and SnCu. The tracks made of ductile metallic material may advantageously be produced by additive or subtractive pattern transfer or by electrolysis of the metal or alloy.

According to one alternative variant embodiment, the constituent material of the tracks may be a hard metallic material chosen from copper Cu, titanium Ti, titanium nitride TiN, tungsten W, tungsten nitride WN, molybdenum Mo, gold Au, chromium Cr, nickel Ni and platinum Pt. The connecting tracks made of hard metallic material may be produced by additive or subtractive pattern transfer. Tracks made of Au, Cu or Ni may be produced by electrolytic growth.

The tracks made of hard metallic material are advantageously produced using the same production technique as the inserts.

The inserts according to the invention are preferably blind micro-tubes the base of which is securely fastened to one of the components. The connecting inserts and if needs be the connecting tracks are thus advantageously fabricated as described in patent application WO 2009/115686 or in patent application EP 2 287 904. When the connecting tracks are produced using the technique described in these applications, they may have a very small thickness e2, advantageously of about 0.1 µm or even 0.05 µm, thereby allowing the forces required to insert the inserts therein to be even more substantially decreased. Generally, the conductive inserts according to the invention may be any shape: micro-tube, tip, open bar, an element having star-shaped, cross-shaped or lobed cross section, etc.

According to one advantageous variant, in order to better distribute mechanical stresses during the insertion, the connecting track portions that are to be penetrated by a given tube take the form of arms that are at least three in number and distributed symmetrically about a point of symmetry, preferably four arms distributed at 90° from each other.

The force F applied per insert may be very low, preferably lower than 5 mN, preferably lower than 0.8 mN and typically equal to 0.5 mN.

Advantageously, the alignment and the application of the force F are carried out at room temperature.

The gap between the two components corresponding to the height H is preferably comprised between a ratio p/20 and a ratio equal to p/2, p being the interconnect pitch between two connecting tracks of a component.

The interconnect pitch p between two connecting tracks of a component may be 50 µm or finer.

The gap between the two components corresponding to the height H is advantageously smaller than 20 µm and typically equal to 1 µm.

According to one advantageous embodiment, one of the components is a chip and the other component is a printed circuit board substrate.

DETAILED DESCRIPTION

Other advantages and features of the invention will become more clearly apparent on reading the detailed description of the invention given by way of nonlimiting illustration with reference to the following figures, in which:

FIG. 1 is a schematic cross-sectional view of two electronic components level with a connecting insert and pad according to the prior art, before their assembly;

FIG. 2 is a schematic cross-sectional view of two electronic components level with a connecting insert and pad according to the prior art, once they have been assembled;

FIG. 3 is a top view of FIG. 2;

FIG. 4 is a schematic top view of two electronic components level with a connecting insert and track according to one embodiment of the invention, once they have been assembled;

FIG. 5 is a schematic top view of two electronic components level with a connecting insert and track according to another embodiment of the invention, once they have been assembled;

FIGS. 6 and 6A are top and cross-sectional views, respectively, of two electronic components level with a connecting insert and track, showing their assembly in detail; and FIGS. 7 to 10 are schematic top views of two electronic components level with a connecting insert and track according to four other embodiments of the invention, once they have been assembled.

For the sake of clarity, elements of electronic components according to the prior art and of electronic components according to the invention that are equivalent are designated by identical references in all of FIGS. 1 to 10.

It will be noted that the various elements, in particular the connecting tracks, according to the invention are shown only for the sake of illustration and that they are not to scale.

FIGS. 1 to 3, which relate to an insertional assembly according to the prior art, have already been described in the preamble. They are not described in detail here.

FIGS. 4 to 10 show a connecting insert 10 inserted into a connecting track 20, each belonging to one of two electronic components 1, 2, such as electronic chips hybridized by means of a pressing tool brought to bear against the top component.

The component 1, which is the flipped component, comprises a substrate 11 to which conductive inserts 10 taking the form of blind tubes are securely fastened via their bases, the inserts all having a height h. The choice of the height h of the inserts advantageously depends on the minimum pitch p between the interconnects to be produced. Thus, the height h is preferably at least about p/20 in order to accommodate for non-planarities between the components 1,2 to be assembled. Preferably, the height h is at most about p/2 in order to limit what are referred to as buckling effects subsequently.

To produce these conductive inserts 10, the process described in patent application WO 2009/115686 is advantageously used. Each insert 10 has a wall length L1 and a unitary wall thickness e1. Here, the expression "unitary thickness e1" is understood to mean the average dimension, or average width, of the wall of the insert in a direction transverse to the longitudinal direction of the latter. The thickness, length and height directions form locally an orthogonal coordinate system. The unitary thickness e1 of a tube 10 is for example equal to 0.2 µm. Each insert tube 10 may have any cross-sectional shape, as depicted in FIG. 4. It may be a question of a tube with a square cross section (FIG. 5), a circular cross section (FIGS. 7 to 10), etc.

The component 2 for its part comprises a substrate 21 on which connecting tracks 20 of the same height H have been produced. The choice of the height H of the tracks 20 advantageously depends on the minimum pitch p between the interconnects to be produced. Thus, the height h is preferably at least about p/20 in order to accommodate for non-planarities between the chips to be assembled and the height H is at most equal to p/2 in order to allow for complete insertion of a tube 10 of maximum height h. The height H of the tracks 20 is calculated so that said height is larger than that h of the inserts 10, in order to prevent the hard metal of the inserts 10 from making contact with the circuit(s) under the tracks 20 during the insertion. Each track 20 has a unitary thickness e2. The unitary thickness e2 is for example equal to 1 μm. Here, the expression "unitary thickness e2" is understood to mean the average dimension, or average width, of the wall of the track in a direction transverse to the longitudinal direction of the latter. The thickness, length and height directions form locally an orthogonal coordinate system.

The tracks 20 take the form of linear vertical features. Each track 20 may take the form of a single elongate strip (FIGS. 4 and 9), a tube, for example with a square or rectangular cross section (FIG. 10), or a cross (FIGS. 5, 7 and 8) with its arms connected by a via.

According to one variant embodiment, the constituent material of the tracks 20 is a ductile metallic material chosen from aluminum Al, indium In, gold Au, tin Sn, lead Pb, bismuth, antimony Sb, an aluminum-copper alloy AlCu and the alloys SnAgCu, SnAg, AgCu and SnCu. The tracks made of ductile metallic material may be produced by additive or subtractive pattern transfer or by electrolysis of the metal or alloy.

According to one alternative variant embodiment, the constituent material of the tracks is a hard metallic material chosen from copper Cu, titanium Ti, titanium nitride TiN, tungsten W, tungsten nitride WN, molybdenum Mo, gold Au, chromium Cr, nickel Ni and platinum Pt. The connecting tracks made of hard metallic material may be produced by additive or subtractive pattern transfer. Tracks made of Au, Cu or Ni may be produced by electrolytic growth.

According to the invention, the dimensions e1, e2 and L1 are defined by calculation so that each area of insertion Si, $Si_1+Si_2+Si_3$, etc. between a given insert and track is substantially equal to a multiple N of the product of the unitary thicknesses N=n*e1*e2 where n is an integer, this multiple N being very much lower than the cross-sectional area S1 of an insert considered transversely to the assembly direction S1=L1*e1.

Thus, by considerably decreasing the cross section of insertion comparatively to that during an insertion of the complete cross section of a tube according to the prior art, as shown in FIG. 3, the constant force of insertion that it is necessary to apply between an insert 10 and a connecting track 20 is very substantially decreased.

In other words, according to the invention, the cross section of insertion between a track and an insert is minimized while keeping it large enough to obtain the mechanical rigidity desired for the interconnecting contact. Depending on circuit layout, tracks may be produced in a number of possible configurations and therefore the number of unitary wall thicknesses e2 intersected by a given insert 10 may be relatively large. Thus, a given insert 10 may be inserted into a single thickness e2 (FIGS. 4 and 9), into two thicknesses e2 (FIG. 10), four thicknesses e2 (FIGS. 5 and 8), eight thicknesses e2 (FIG. 7), etc.

The various steps of the assembly process according to the invention will now be described.

Step 1: the two components 1, 2 are aligned and brought together so that each insert 10 faces one portion of a connecting 20.

Step 2: a force F is applied in the assembly direction X orthogonal to the sides of the substrates bearing the inserts 10 and tracks 20. The force F is applied using a pressing tool brought to bear against the top component 1 and leads to insertion of the inserts 10 into the tracks 20. Si designates the cross-sectional area intersected by each insert 10 and is substantially equal to a multiple N of the product of the unitary thicknesses N=n*e1*e2. The cross-sectional area Si is very small compared to the applied force, the stress generated is very high and each track 20 is thus plastically deformed. The insertion of each insert 10 takes place via plastic deformation of each corresponding track 20.

Step 3: the force F is applied until the entire height h of the inserts 10 has been inserted into the connecting tracks 20.

Step 4: the pressing tool is released and retracted. The two components 1, 2 are assembled (hybridized), an electrical connection having been established between each connecting track 20 and each conductive insert 10.

FIG. 6A shows in detail an assembly level with an insert 10 and the corresponding track 20, obtained using the assembly process described above.

The insertional force required according to the invention is proportional to the cross section of insertion common to each insert 10 and each track 20. Thus, for example, by choosing a track 20 of unitary width e2 very much smaller than the circular perimetric cross section of a tube of radius R, insertion of a tube 10 of radius R into a single track 20 according to the invention (FIG. 9) requires much less insertional force than an insertion, according to the prior art, of the entire circumference of the same tube (FIG. 3), in a ratio equal to $e2/2*\pi*R$.

Specifically, an insertion according to FIG. 9 involves a cross section equal to e1*e2 whereas an insertion according to FIG. 3 involves a cross section equal to $e1*2*\pi*R$.

In configurations in which the interconnects are subjected to substantial thermomechanical solicitations, the insert 10 may be inserted into two track portions that are symmetrical about a point. Thus, it is possible for example to choose for an insert 10 and a track 20 to intersect a number of times symmetrically about the centre of the insert (FIGS. 5, 7 and 8), i.e. so that they counterbalance.

The number of track portions 20 to be intercepted by a tube 10 may be multiplied, especially in order to allow tracks 20 of very small unitary thickness e2 (typically of about the unitary thickness of the wall e1 of an insert) to be used. Thus by way of example, one tube may be inserted into eight unitary wall thicknesses as shown in FIG. 7. Thus, it is possible for the thicknesses e1 and e2 to be very small, typically equal to 0.1 μm, the cross section of insertion, equal to 8*e1*e2, then being very small, typically equal to 8*0.1*0.1, i.e. to 0.08 μm², and likewise the required insertional force.

By way of example, the case where the connections to be produced have a pitch equal to 10 μm and where a tube 10 of radius R=2.5 μm is used is considered.

In the prior art, such a tube 10 requires an insertional force F1 equal to 4 mN if its entire circumference is to be inserted into an aluminum connection pad having a diameter equal to 7 μm.

According to the invention, in order to decrease considerably the insertional force, an aluminum track 20 having a symmetric cross shape (FIG. 8) and an aluminum track 20 taking the form of an elongate strip (FIG. 9) are produced with unitary thicknesses e2 equal to 1 μm. It will be noted that in the example shown, the cross 20 is connected to a via aperture 22 of diameter equal to 2 μm, this connection taking the form of a round pad 23 of diameter equal to 3 μm surmounted by four arms 20 of unitary width e2.

Preferably, in order to better distribute mechanical stresses during the insertion, the track portions 20 to be intercepted by a tube 10 take the form of arms that are at least three in number and distributed symmetrically about a point of symmetry. It may therefore for example be a question of three arms distributed at 120° to each other, of four arms distributed at 90° from each other so as to form a symmetric cross (FIG. 8), or of eight arms grouped pairwise, one group being distributed at 90° to another so as to again form a symmetric cross (FIG. 7). Thus, an isostatic mechanical connection is obtained between the inserts and tracks in every direction.

For a given insertion depth, the insertional forces to be applied to the cross in FIG. 8 and to the strip in FIG. 9, respectively, are, comparatively to the force F1 according to the prior art, equal to:

$F2=F1*4*e/2\pi R$, i.e. equal to $0.25*F1$;

$F3=F1*e/2\pi R$, i.e. equal to $0.06*F1$.

Thus, a very substantial decrease in the insertional force required is obtained with a track 20 according to the invention comparatively to a complete circumferential insertion into a ductile pad made of the same material according to the prior art.

Theoretical required insertional forces have been compared by varying the tube diameter of the inserts 10 and the unitary thickness of the tracks 20 with the area of insertion Si.

The results, between a configuration with insertion according to the prior art (FIG. 3), an insertion according to the invention with a single elongate track 20 (FIG. 9) and an insertion according to the invention with a track 20 taking the form of a tube with a rectangular cross-sectional area (FIG. 10) are given in the following tables 2 to 4, respectively.

It will be noted that the pads according to the prior art and the tracks 20 according to invention are made of aluminum and that the insertional force calculated at constant pressure for insertion of the entirety of the circumference of a tube 10 into a pad according to the prior art is equal to 5 mN. The force required to obtain the same pressure was then calculated comparatively for the two configurations according to the invention.

TABLE 2

(TUBE 10/CONNECTING PAD 20 ASSEMBLY ACCORDING TO FIG. 3)

| Wall thickness e1 (μm) | Tube diameter 10 | Cross section of insertion S (μm²) | Pressure equal to F/S (Gpa) | Force F (mN) |
|---|---|---|---|---|
| 0.2 | 4 | 2.512 | 1.99 | 5 |

TABLE 3

(TUBE 10/CONNECTING TRACK 20 ASSEMBLY ACCORDING TO FIG. 9)

| Wall thickness e1 (μm) | Track thickness equal to e2 (μm) | Cross section of insertion Si (μm²) | Force F' (mN) | Insertional force reduced by (%) 100-F'/F |
|---|---|---|---|---|
| 0.2 | 2 | 0.4 | 0.80 | 84% |

TABLE 4

(TUBE 10/CONNECTING TRACK 20 ASSEMBLY ACCORDING TO FIG. 10)

| Wall thickness e1 (μm) | Track thickness equal to 2*e2 (μm) | Cross section of insertion Si (μm²) | Force F' (mN) | Insertional force reduced by (%) 100-F'/F |
|---|---|---|---|---|
| 0.2 | 0.2 | 0.08 | 0.1592 | 97% |

From tables 2 to 4 it will be clear that the insertional force per insert may be considerably decreased by virtue of the invention, by 84 to 97% in this example.

In conclusion, comparatively to prior-art thermocompression assembly processes such as described in the aforementioned patent applications WO 2009/115686 and EP 2 287 904, the invention allows the constant insertional force to be considerably decreased for a given ductile material.

One beneficial advantage of the invention is that it allows the number of points hybridized at constant insertional force to be multiplied for a given ductile material.

According to the invention, it is possible to produce a stack of two assemblies each obtained using the reduced-insertional-force assembly process described above.

The invention is broadly applicable to any microelectronic devices intended to operate at a high operating temperature and requiring front-to-front interconnects having a very fine pitch.

One particularly advantageous application of the invention is the production of three-dimensional 3D structures or multispectral heterogeneous imagers.

Many other applications may be envisioned for the invention and more particularly for:

large heterogeneous detector arrays with large numbers of insertional connections (cooled IRCMOS arrays, X-ray detector arrays, etc.);

temperature-sensitive arrays that are hybridized "cold" (i.e. at room temperature); and arrays sensitive to mechanical stresses.

It is for example possible to produce such arrays by providing ductile aluminum tracks according to the numerical example given above: the same force of about 0.5 mN may be applied to produce a connection according to the invention in an aluminum track 20 such as shown in FIG. 9 as for a connection according to the prior art in an indium pad 20 as shown in FIG. 3. However, it is better to apply a small force to insert an insert into an aluminum track, because it is much easier and less expensive to produce a track 20 made of aluminum as shown in FIG. 9 by a subtractive photolithography technique (etching) than an indium pad 20 as shown in FIG. 3 by an additive photolithography technique (lift-off) or by electrolysis.

Other variants and improvements may be provided without however departing from the scope of the invention.

The invention is not limited to the examples described above; in particular features of the illustrated examples may be combined together in variants that are not illustrated.

CITED REFERENCES

[1]: B. Goubault de Brugière, F. Marion, M. Fendler et al. "*Micro tube insertion into indium, copper and other materials for 3D applications.*" Proc 60th Electronic Components and Technology Conf, Las Vegas, Nev., 2010 p 1757;

[2]: B. Goubault de Brugière, F. Marion, M. Fendler et al "*A 10 μm pitch interconnection technology using micro tube insertion into Al-Cu for 3D applications.", Proc 61st Electronic Components and Technology Conf, Orlando, Fla., 2011 p 1400;

[3]: D. Saint-Patrice, F. Marion, M. Fendler et al. "*New Reflow Soldering and Tip in Buried Box (TB2) Techniques For Ultrafine Pitch Megapixels Imaging Array*," Proc 58th Electronic Components and Technology Conf, Orlando, Fla., 2008 p 46-53.

The invention claimed is:

1. A flip-chip type process for assembling two electronic components, said components each comprising what is referred to as an assembly side, in which the two assembly sides are brought nearer to each other in what is referred to as an assembly direction X and a given force F is applied to one and/or other of the components, one and/or other of the assembly sides comprising:
   connecting inserts made of a rigid material having an elongate longitudinal shape in the assembly direction X; and
   connecting tracks made of a material of lower hardness than that of the inserts and of elongate longitudinal shape transversely to the assembly direction X,
wherein:
   the inserts are aligned facing the corresponding tracks so that the inserts and the tracks form, pairwise, after assembly, at least one substantially transversal intersection; and
   then, the given force F is applied in order to make the inserts penetrate into the tracks until the assembly of the two components is obtained;
   wherein the connecting inserts of a component having a unitary wall thickness e1 and a unitary wall length L1 whereas the connecting tracks of a component have a unitary thickness e2, the unitary thicknesses e1 and e2 being the smallest dimensions considered transversely to the assembly direction X, and the length L1 being the largest wall dimension considered transversely to the assembly direction X; and
   wherein, before the inserts have been aligned facing the corresponding tracks, the dimensions e1, e2 and L1 are defined so that each area of insertion Si, $Si_1+Si_2+Si_3$, etc. between a given insert and track is substantially equal to a multiple N of the product of the unitary thicknesses $N=n*e1*e2$ where n is an integer, this multiple N being very much lower than the cross-sectional area S1 of an insert considered transversely to the assembly direction $S1=L1*e1$.

2. The assembly process as claimed in claim 1, wherein the area of insertion Si is smaller by at least 40% than the cross-sectional area S1.

3. The assembly process as claimed in claim 1, wherein the unitary wall thickness e1 of the inserts is comprised between 0.1 and 1 μm.

4. The assembly process as claimed in claim 1, wherein the unitary track thickness e2 is comprised between 0.05 and 2 μm.

5. The assembly process as claimed in claim 1, wherein the constituent material of the tracks is a ductile metallic material chosen from aluminum Al, indium In, gold Au, tin Sn, lead Pb, bismuth, antimony Sb, an aluminum-copper alloy AlCu and the alloys SnAgCu, SnAg, AgCu and SnCu.

6. The assembly process as claimed in claim 5, wherein the tracks made of ductile metallic material are produced by additive or subtractive pattern transfer or by electrolysis of the metal or alloy.

7. The assembly process as claimed in claim 1, wherein the constituent material of the tracks is a hard metallic material chosen from copper Cu, titanium Ti, titanium nitride TiN, tungsten W, tungsten nitride WN, molybdenum Mo, chromium Cr, nickel Ni and platinum Pt.

8. The assembly process as claimed in claim 7, wherein the connecting tracks made of hard metallic material are produced by additive or subtractive pattern transfer.

9. The assembly process as claimed in claim 7, wherein tracks made of Au, Cu or Ni are produced by electrolytic growth.

10. The assembly process as claimed in claim 7, wherein the tracks made of hard metallic material are produced using the same production technique as the inserts.

11. The assembly process as claimed in claim 1, wherein the inserts are blind micro-tubes the base of which is securely fastened to one of the components.

12. The assembly process as claimed in claim 1, wherein the connecting track portions that are to be penetrated by a given tube take the form of arms that are at least three in number and distributed symmetrically about a point of symmetry.

13. The assembly process as claimed in claim 1, wherein the force F applied per insert is lower than 5 mN.

14. The assembly process as claimed in claim 1, wherein the alignment and the application of the force F are carried out at room temperature.

15. The assembly process as claimed in claim 1, wherein the gap between the two components corresponding to the height H is comprised between a ratio p/20 and a ratio equal to p/2, p being the interconnect pitch between two connecting tracks of a component.

16. The assembly process as claimed in claim 1, wherein the interconnect pitch p between two connecting tracks of a component (1, 2) is 50 μm or finer.

17. The assembly process as claimed in claim 1, wherein the gap between the two components corresponding to the height H is smaller than 20 μm.

18. The assembly process as claimed in claim 1, wherein one of the components is a chip and the other component is a printed circuit board substrate.

19. The assembly process as claimed in claim 3, wherein the unitary thickness e1 is comprised between 0.1 and 0.5 μm.

20. The assembly process as claimed in claim 4, wherein the unitary thickness e2 is comprised between 0.1 and 1 μm.

21. The assembly process as claimed in claim 12, wherein the connecting track portions that are to be penetrated by a given tube take the form of four arms distributed symmetrically about the point of symmetry at 90° from each other.

22. The assembly process as claimed in claim 13, wherein the force F applied per insert is lower than 0.8 mN.

23. The assembly process as claimed in claim 22, wherein the force F applied per insert is equal to 0.5 mN.

24. The assembly process as claimed in claim 17, wherein the gap between the two components corresponding to the height H is equal to 1 μm.

* * * * *